Sept. 17, 1963 C. W. HAAS, JR 3,104,329

CONSTANT-WIDTH RECTANGULAR PULSE GENERATOR UTILIZING TRANSFORMER HAVING TWO PRIMARY WINDINGS IN REGENERATIVE FEEDBACK CIRCUIT

Filed Jan. 28, 1960

INVENTOR
C. W. HAAS, JR.
BY
[signature]
ATTORNEY

United States Patent Office 3,104,329
Patented Sept. 17, 1963

3,104,329

CONSTANT-WIDTH RECTANGULAR PULSE GENERATOR UTILIZING TRANSFORMER HAVING TWO PRIMARY WINDINGS IN REGENERATIVE FEEDBACK CIRCUIT

Charles W. Haas, Jr., Morris Plains, N.J., assignor to Bell Telephone Laboratories, Incorporated, New York, N.Y., a corporation of New York Filed Jan. 28, 1960, Ser. No. 4,570
11 Claims. (Cl. 307—88.5)

Figure 1:
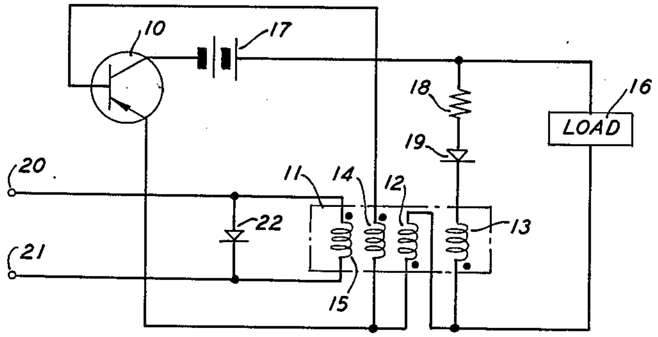

This invention relates to waveforming circuits and in particular to regenerative amplifiers for producing substantially rectangular pulses in response to triggering pulses.

Regenerative amplifiers of various configurations are well known. These circuits generally comprise an active device, such as a transistor or vacuum tube, and a transformer-coupled regenerative feedback path. Although the lengths or durations of the rectangularly shaped pulses produced by such circuits may be substantially constant for fixed impedance load circuits, it is frequently found that they will change with changes in the load circuit impedances. When, for example, a load circuit is connected in parallel with the primary winding of the feedback path transformer so as to provide load voltage type of feedback, the output pulse length generally decreases as the impedance value of the load circuit decreases until an impedance value is reached below which the amplifier fails to regenerate. Furthermore, when a load circuit is connected in series with the primary winding so as to provide load current type of feedback, the output pulse length generally decreases as the impedance value of the load circuit increases until an impedance value is reached above which the amplifier fails to regenerate. In many applications, such changes in pulse length with changes in load impedance are not acceptable.

An object of the present invention is to generate and couple substantially constant duration pulses into a load circuit whose impedance may change.

In one of its broader aspects, the present invention provides both load voltage and load current types of feedback in a regenerative amplifier to produce output pulses which are substantially constant in duration with load impedance changes. In accordance with the invention, the voltage type of regenerative feedback provide the majority of the feedback signal for a relatively high load impedance. As this relatively high load impedance is decreased, the current type of regenerative feedback provides an increasing signal which is added to the relatively constant voltage type of feedback signal to increase the drive on the amplifier. By increasing the drive on the amplifier as the load impedance is decreased, a substantially constant duration output pulse is produced.

In each of several embodiments of the invention, a regenerative feedback path around a transistor includes a transformer having first and second primary windings and a secondary winding. In each embodiment, the first primary winding, a load circuit and a source of direct potential are serially connected between the collector and emitter electrodes of the transistor while the secondary winding is connected between the emitter and base electrodes of the transistor. The second primary winding is connected in parallel with the load circuit in one embodiment and in parallel with a series circuit including the load circuit and the first primary winding in the other embodiment. Each embodiment includes a triggering circuit for applying a forward biasing pulse between the base and emitter electrodes. The primary windings are phased or poled in a regenerative sense with respect to the secondary winding so that the first primary winding is responsive to the load circuit current to provide a regenerative current type of feedback while the second primary winding is responsive to the load circuit voltage to provide a regenerative voltage type of feedback.

In each of the above-described embodiments, a reverse voltage is induced in the parallel-connected primary winding as a result of the initial feedback from the series-connected winding. The current that flows as a result of this reverse voltage reduces the base current drive applied to the transistor. In accordance with a feature of the invention, this effect may be eliminated by connecting in series with the parallel-connected winding a diode which is poled in a reverse biased sense with respect to the induced voltage.

Figure 2:
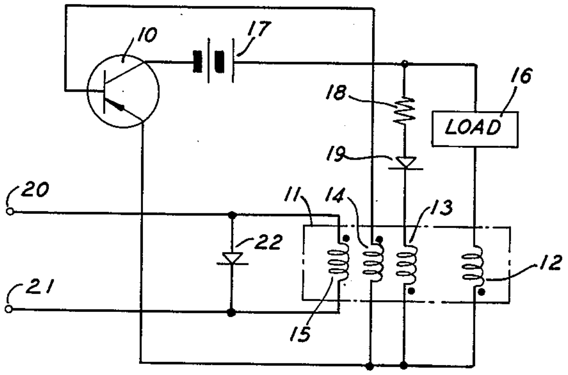

Other objects and features of the invention will become apparent from a study of the following detailed descriptions of several specific embodiments. In the drawings:

FIGS. 1 and 2 each illustrate an embodiment of the invention.

The embodiment of the invention illustrated in FIG. 1 includes a transistor 10 having emitter, base and collector electrodes and a transformer 11 having a pair of primary windings 12 and 13, a secondary winding 14, and a trigger input winding 15. Primary winding 12, a load 16 and a source of direct potential 17 are serially connected between the collector and emitter electrodes of transistor 10. A serially connected combination comprising primary winding 13, a resistor 18 and a diode 19 is connected in parallel with load 16 so that diode 19 is poled in a forward biased sense with respect to source 17. Secondary winding 14 is connected between the base and the emitter electrodes of transistor 10. Direct potential source 17 is connected to reverse bias the collector-to-base junction of transistor 10. Windings 12, 13, and 14 are phased or poled to produce a regenerative feedback path as indicated, in accordance with convention, by the dots associated with the respective windings. Trigger input winding 15 is connected to a pair of input terminals 20 and 21. The poling of winding 15 with respect to the remaining windings on transformer 11 is also indicated by a dot associated with the winding. A diode 22 is connected in parallel with winding 15.

In its quiescent state, transistor 10 in the embodiment of FIG. 1 is in its Off or non-conducting condition. When a pulse is applied between terminals 20 and 21 so that terminal 20 is less positive than terminal 21, a pulse is coupled into secondary winding 14 so that the emitter to base junction of transistor 10 is forward biased which permits an emitter to collector current to flow around the path including load 16 and primary windings 12 and 13. The emitter to collector current causes energy to be stored in transformer 11 at a rate determined by several of the circuit parameters. (Because blocking oscillators operate in a nonlinear manner, the details of such an operation are involved and therefore are not discussed herein. Such discussions, however, may be found in the literature.) When the rate of energy storage is increasing, a voltage is induced across secondary winding 14 which maintains a forward bias on the emitter to base junction so as to produce regenerative feedback. When the rate of change of the energy storage begins to diminish, voltage of an opposite polarity is produced across secondary winding 14 which tends to turn Off transistor 10, thereby further diminishing the rate of change of the energy storage. This is a regenerative feedback action that causes transistor 10 to rapidly revert to its quiescent state.

In accordance with the invention, for relatively low impedance loads primary winding 12 couples most of the energy to produce the feedback signal across secondary winding 14 whereas for relatively high impedance loads primary winding 13 couples most of the energy to produce the feedback signal across secondary winding 14.

This feature of the invention enables embodiments of the invention to be constructed without having to develop rather complex nonlinear equations. In particular, a relatively low impedance load is used with conventional techniques to determine the number of turns for windings 12 and 14 and then a relatively high impedance load is used to determine the turns for winding 13. The control of the pulse length for relatively high load impedances may also be changed without affecting the pulse length for relatively low load impedances by changing the value of resistor 18. At intermediate load impedances, windings 12 and 13 cooperate to feed back a signal that produces pulse lengths which are substantially equal to those produced at relatively high and low load impedances.

When the majority of the signal feedback is by way of winding 12, an initial reverse voltage is induced across winding 13. When a current is permitted to flow as a result of this reverse voltage, a loading effect is produced which results in reducing the feedback signal appearing across secondary winding 14, thereby reducing the drive on transistor 10. In accordance with one feature of the invention, diode 19 prevents the reverse voltage induced across winding 13 from producing a current flow.

Trigger input winding 15 permits the triggering source to be matched to the disclosed embodiment. Any other well known triggering arrangement may be used, however, without departing from the spirit and scope of the invention.

Diode 22 connected in parallel with winding 15 limits the overshoot at the end of the output pulse. Such arrangements are both well known and generally required in circuits of this general type in order to prevent the circuit from oscillating independently of the triggering pulses.

The embodiment of FIG. 2 is identical to that of FIG. 1 with the exception that the serially connected combination comprising resistor 18, diode 19 and winding 13 is connected in parallel with a series circuit including load 16 and winding 12. The mode of operation is substantially identical to that of the embodiment of FIG. 1.

In each of the disclosed embodiments, emitter to base biasing arrangements are not illustrated. Although such biasing arrangements are unnecessary when using silicon-type transistors for transistor 10, it may be necessary to use conventional biasing arrangements when using other types of transistors, such as germanium-type transistors. Furthermore, although a single transformer has been illustrated in each embodiment, a pair of transformers having single primary windings may be used with the secondary windings of these transformers being connected in series.

Although only two embodiments of the invention have been described in detail, it is to be understood that various other embodiments may be devised by those skilled in the art without departing from the spirit and scope of the invention.

What is claimed is:

1. A regenerative amplifier comprising amplifying means having a pair of input terminals and a pair of output terminals, a load circuit, means for connecting said load circuit between said output terminals, means connected to said load circuit to produce a signal, proportional to both the current through said load circuit and the voltage across said load circuit, means for applying said signal to said input terminals in a regenerative sense.

2. A regenerative amplifier in accordance with claim 1 in which said amplifying means comprises a transistor having emitter, base and collector electrodes with said emitter and base electrodes forming said input terminals and said collector and emitter electrodes forming said output terminals.

3. A regenerative amplifier in accordance with claim 1 wherein said means connected to said load circuit to produce a signal proportional to both the current through said load circuit and the voltage across said load circuit comprises a transformer having a first primary winding through which at least a portion of said load circuit current flows, a second primary winding across which at least a portion of said load circuit voltage is applied and a secondary winding across which said signal is produced.

4. A regenerative amplifier in accordance with claim 3 in which said amplifying means comprises a transistor having emitter, base and collector electrodes with said emitter and base electrodes forming said input terminals and said collector and emitter electrodes forming said output terminals.

5. A regenerative amplifier comprising amplifying means having a pair of input terminals and a pair of output terminals, a load circuit, a transformer having first and second primary windings and a secondary winding, means for connecting said secondary winding between said input terminals, means for serially connecting said load circuit and said first primary winding between said output terminals so that at least a portion of the current through said load circuit passes through said first primary winding to produce signals at said secondary winding which are applied to said amplifying means in a regenerative sense, and means for connecting said second primary winding to said serially connected load circuit and first primary winding so that at least a portion of the voltage across said load circuit is applied across said second primary winding to produce signals at said secondary winding which are applied to said amplifying means in a regenerative sense.

6. A regenerative amplifier in accordance with claim 5 in which said amplifying means comprises a transistor having emitter, base and collector electrodes with said emitter and base electrodes forming said input terminals and said collector and emitter electrodes forming said output terminals.

7. A regenerative amplifier in accordance with claim 5 in which said means for serially connecting said load circuit and said first primary winding between said output terminals includes a source of direct potential and said means for connecting said second primary winding includes a serially connected diode poled in a forward biased sense with respect to said source of direct potential.

8. A regenerative amplifier in accordance with claim 7 in which said amplifying means comprises a transistor having emitter, base and collector electrodes with said emitter and base electrodes forming said input terminals and said collector and emitter electrodes forming said output terminals.

9. A regenerative amplifier comprising a transistor having emitter, base and collector electrodes, a load circuit, a transformer having first and second primary windings and a secondary winding, a source of direct potential, means connecting said secondary winding between said base and emitter electrodes, means for serially connecting said source, said load circuit and said first primary winding between said collector and emitter electrodes so that signals produced in said secondary winding as a result of current flowing through said first primary winding are applied to said transistor in a regenerative sense, a resistor, a diode, and means for serially connecting said resistor, said diode and said second primary winding across said load circuit so that said diode is connected in a forward biased sense with respect to said source and signals produced in said secondary winding as a result of the load circuit voltage appearing across said second primary winding are applied to said transistor in a regenerative sense.

10. A regenerative amplifier comprising a transistor having emitter, base and collector electrodes, a load circuit, a transformer having first and second primary windings and a secondary winding, a source of direct potential, means connecting said secondary winding between said base and emitter electrodes, means for serially connecting said source, said load circuit and said first primary winding between said collector and emitter electrodes so that signals produced in said secondary winding as a result of current flowing through said first primary winding are applied to said transistor in a regenerative sense, a resistor, a diode, and means for serially connecting said resistor, said diode and said second primary winding across the serially connected combination comprising said load circuit and said first primary winding so that said diode is connected in a forward biased sense with respect to said source and signals produced in said secondary winding as a result of the load circuit voltage appearing across said second primary winding are applied to said transistor in a regenerative sense.

11. In a regenerative amplifier for producing substantially rectangularly shaped pulses in a load circuit, a regenerative feedback path comprising a transformer having a first primary winding through which flows at least a portion of the current through said load circuit and a second primary winding across which is applied at least a portion of the voltage across said load circuit, each of said windings connected in said feedback path in a regenerative sense.

References Cited in the file of this patent

UNITED STATES PATENTS

| | | |
|---|---|---|
| 2,926,284 | Finkelstein et al. | Feb. 23, 1960 |
| 2,936,383 | Mees | May 10, 1960 |
| 3,021,451 | Lundahl | Feb. 13, 1962 |